United States Patent
Chen

(10) Patent No.: US 9,142,538 B1
(45) Date of Patent: Sep. 22, 2015

(54) THREE-DIMENSIONAL SEMICONDUCTOR DEVICE

(71) Applicant: MACRONIX INTERNATIONAL CO., LTD., Hsinchu (TW)

(72) Inventor: Shih-Hung Chen, Hsinchu County (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 14/489,531

(22) Filed: Sep. 18, 2014

(51) Int. Cl.
| | |
|---|---|
| *H01L 23/48* | (2006.01) |
| *H01L 23/52* | (2006.01) |
| *H01L 29/40* | (2006.01) |
| *H01L 27/02* | (2006.01) |
| *H01L 27/115* | (2006.01) |

(52) U.S. Cl.
CPC ........ *H01L 27/0207* (2013.01); *H01L 27/1157* (2013.01); *H01L 27/11524* (2013.01); *H01L 27/11551* (2013.01); *H01L 27/11578* (2013.01)

(58) Field of Classification Search
USPC .......... 257/751, 774, 762, 200, 298, E21.579, 257/776, E21.586, 773, 374, 499–564, 763, 257/757, 324, 315, 319, E29.309, E21.423, 257/E21.614; 438/762, 639, 643, 657
See application file for complete search history.

(56) References Cited

U.S. PATENT DOCUMENTS

| | | | |
|---|---|---|---|
| 2010/0052042 A1* | 3/2010 | Tanaka et al. ................. | 257/324 |
| 2014/0191388 A1 | 7/2014 | Chen | |
| 2014/0284675 A1* | 9/2014 | Watanabe ...................... | 257/314 |
| 2015/0001613 A1* | 1/2015 | Yip et al. ...................... | 257/329 |
| 2015/0155388 A1* | 6/2015 | Chen ............................ | 257/315 |

\* cited by examiner

*Primary Examiner* — Dao H Nguyen
*Assistant Examiner* — Tram H Nguyen
(74) *Attorney, Agent, or Firm* — McClure, Qualey & Rodack, LLP

(57) ABSTRACT

A 3D semiconductor device is provided, comprising memory layers, a selection line, bit lines, strings, memory cells defined by the strings, the selection line, and the bit lines, wherein the memory cells are arranged in a plurality of rows having a first direction, and a stair contact structure including stair contacts and conductive lines, wherein the stair contacts are arranged in a plurality of columns having a fourth direction. The 3D semiconductor device satisfies the following condition: $1 < A \leq 10$ and $1 < B \leq 30$; wherein A is the number of the rows of the memory cells in the selection line or $A = a/X_{BL}$, a is a memory cell pitch and $X_{BL}$ is a bit line pitch along the first direction, B is the number of the columns of the stair contacts or $B = Y_{SC}/Y_D$, and $Y_{SC}$ is a stair contact pitch and $Y_D$ is the conductive line pitch along the fourth direction.

14 Claims, 5 Drawing Sheets

THREE-DIMENSIONAL SEMICONDUCTOR DEVICE

BACKGROUND

1. Field of the Invention

The disclosure relates in general to a three-dimensional (3D) semiconductor device, more particularly to a high speed vertical channel (VC) 3D semiconductor device.

2. Description of the Related Art

A nonvolatile semiconductor memory device is typically designed to securely hold data even when power is lost or removed from the memory device. Various types of nonvolatile memory devices have been proposed in the related art. Also, manufactures have been looking for new developments or techniques combination for stacking multiple planes of memory cells, so as to achieve greater storage capacity. For example, several types of multi-layer stackable thin-film transistor (TFT) NAND-type flash memory structures have been proposed. Various semiconductor devices with three-dimensional (3D) stacked structures, having single-gate unit cells, double gate unit cells or surrounding gate unit cells, have been provided.

It is desirable to develop a semiconductor device with 3D stacked structure not only with larger number of multiple planes being stacked to achieve greater storage capacity, but also with memory cells having excellent electrical properties (such as reliability of data storage and speed of operation), so that the memory cells can be erased and programmed effectively. Typically, NAND Flash page size is proportional to the number of the bit lines (BL). Accordingly, when the device is scaled down, not only the decreased cost but also the increased read/write data rate are achieved due to the increasing of parallel operation, which leads to higher data rate. Typically, a 3D vertical channel (VC) semiconductor device have larger hole size to reduce the process challenge. However, larger cell size results in less bit line number, less parallel operation, and less speed of read/write data. For a conventional cell design, the cells arranged in the same row are selected by one selection line, and the cells arranged in the same column are corresponding to one bit line. Take 16 cell strings (arranged as 4 rows and 4 columns) with 4 BLs as example; each cell string corresponds to one BL and one selection line (such as SSL 1/2/3/4). To obtain all the dada in this example, it is required to select the SSL1 to get 4 strings data, then followed by selecting the SSL2, SSL 3 and SSL 4 to get the next 12 strings data. It needs 4 cycles of operation to get all of the strings data under SSL 1/2/3/4. Also, when the SSL1 is operated, the cell strings in the SSL 2/3/4 are also suffered from the same gate bias, thereby suffering from gate disturbance. Besides, the "non-selected strings" having the gate voltage means the unnecessary power consumption. Thus, the conventional cell design has not only low speed of operation, but also large power consumption and large disturbance.

SUMMARY

The disclosure relates to a three-dimensional (3D) semiconductor device. According to the embodied structure of the 3D semiconductor device, all of the cells can be read at the same time, which increases the operation speed. Also, the bandwidth of the 3D semiconductor device is enlarged (increased), the power consumption is reduced, and the disturbance between adjacent cells during reading is also reduced.

According to the present disclosure, a 3D semiconductor device is provided, comprising: a plurality of memory layers vertically stacked on a substrate and parallel to each other; a selection line disposed on the memory layers; a plurality of bit lines disposed on the selection line, the bit lines arranged in parallel to each other and in perpendicular to the selection line; a plurality of strings electrically connected to the selection line and disposed vertically to the memory layers and the selection line; a plurality of memory cells respectively defined by the strings, the selection line, and the bit lines, wherein the memory cells are arranged in a plurality of rows having a first direction and a plurality of columns having a second direction, the selection line is parallel to the first direction, the included angle between the first direction and the second direction is an acute angle, and the adjacent memory cells in the same column are electrically connected to the different bit lines; and a stair contact structure, including a plurality of stair contacts and a plurality of conductive lines, wherein the stair contact structure is electrically connected to the memory layers, each of the conductive lines is electrically connected to each of the stair contacts, the stair contacts are arranged in a plurality of rows having a third direction and a plurality of columns having a fourth direction, and the bit lines are parallel to the fourth direction. The 3D semiconductor device satisfies the following condition: $1<A\leq10$ and $1<B\leq30$; wherein A is the number of the rows of the memory cells in the selection line or $A=a/X_{BL}$, wherein a is a memory cell pitch along the first direction, and $X_{BL}$ is a bit line pitch along the first direction; wherein B is the number of the columns of the stair contacts or $B=Y_{SC}/Y_D$, wherein $Y_{SC}$ is a stair contact pitch along the fourth direction, and $Y_D$ is the conductive line pitch along the fourth direction.

The disclosure will become apparent from the following detailed description of the preferred but non-limiting embodiments. The following description is made with reference to the accompanying drawings.

DETAILED DESCRIPTION

The embodiments of the present disclosure disclosed below are for elaborating a high speed three-dimensional (3D) semiconductor device, such as a vertical-channel (VC) 3D semiconductor device. According to the structure of the 3D semiconductor device of the embodiments, all of the cells can be read at the same time, which increases the operation speed. Additionally, the bandwidth of the 3D semiconductor device is enlarged (increased), the power consumption is reduced, and the disturbance between adjacent cells during reading is also reduced.

Figure 1:
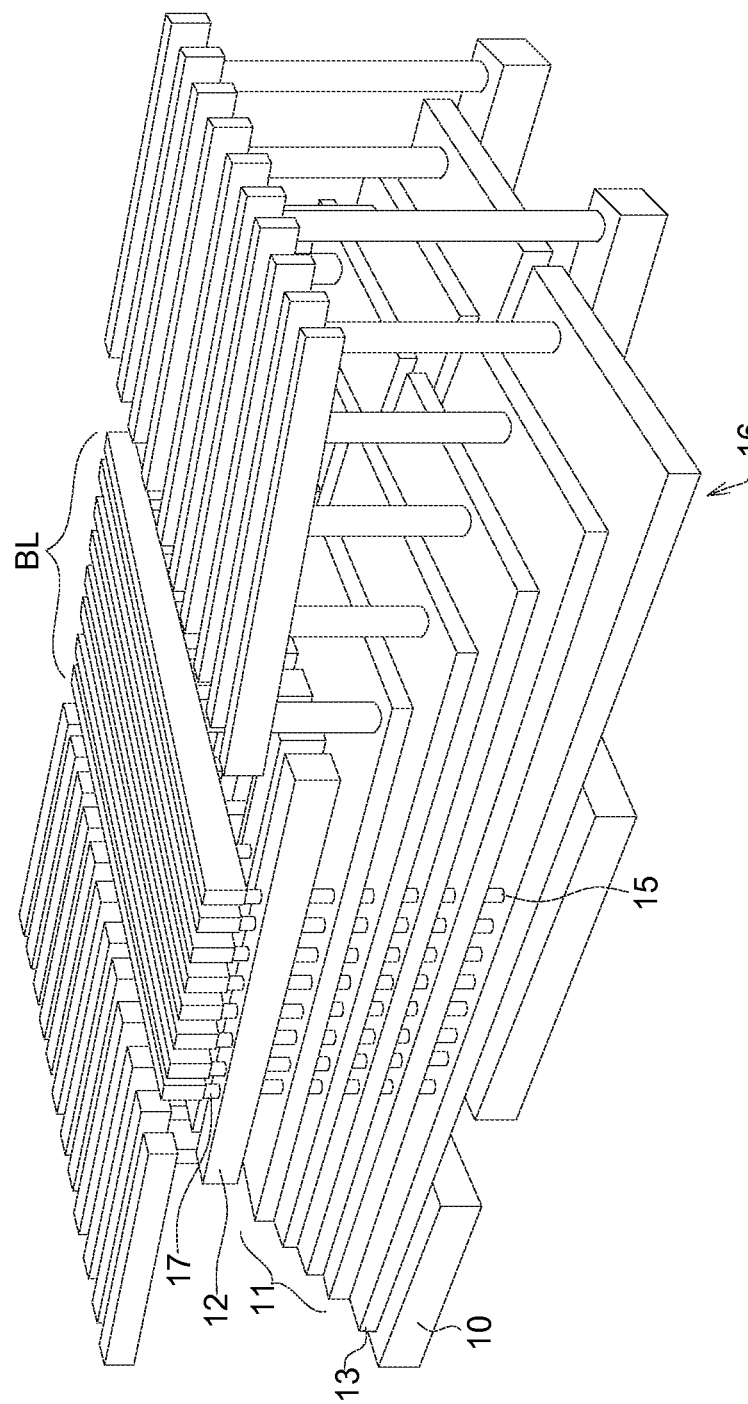
FIG. 1 is a perspective view of a 3D semiconductor device.

The disclosure can be applied to various applications with different cell arrays of 3D semiconductor devices, such as a vertical-channel (VC) 3D semiconductor device. FIG. 1 is a perspective view of a 3D semiconductor device. The 3D semiconductor device includes a plurality of memory layers 11, at least one selection line 12 or a plurality of selection lines 12, a plurality of bit lines BL, a plurality of strings 15, a plurality of memory cells, and a stair contact structure 16.

As shown in FIG. 1, the memory layers 11 (comprising control gates) are vertically stacked on a substrate 10 and are parallel to each other. The at least one selection line 12 or the selection lines 12 are disposed on the memory layers 11, and the selection lines 12 are parallel to each other. The bit lines BL are disposed on the selection line(s) 12, and the bit lines BLs are arranged in parallel to each other and in perpendicular to the selection line(s) 12. The strings 15 are formed vertically to the memory layers 11 and the selection line(s) 12. The strings 15 are electrically connected to the corresponding selection line(s) 12. The memory cells are respectively defined by the strings 15, the selection line(s) 12, and the bit lines BL. The memory cells are arranged in a plurality of rows and a plurality of columns, and the row direction is parallel to the selection line(s) 12. The stair contact structure 16 is electrically connected to the memory layers 11.

The 3D semiconductor device may further include a plurality of string contacts 17 formed vertically to the memory layers 11 and the selection line(s) 12, and each of the string contacts 17 is disposed correspondingly at each of the strings 15 of the memory cells. The string contacts 17 are electrically connected to the corresponding selection line(s) 12 and the corresponding bit lines BL.

The 3D semiconductor device may further comprise other known elements; for example, the selection lines 12 are the upper select lines (upper SG), and the lower select lines (lower SG) 13 are further formed under the memory layers 11.

Figure 2:
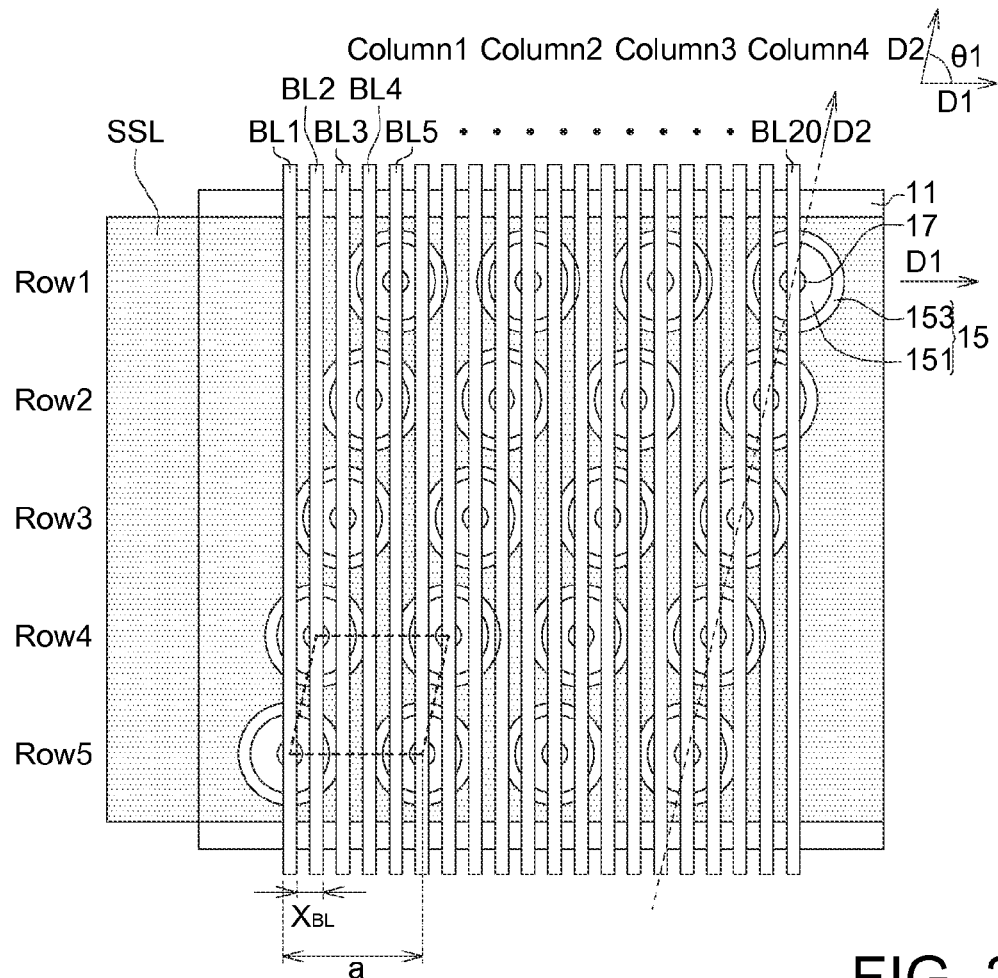
FIG. 2 is a top view of a memory cell design of a 3D semiconductor device according to an embodiment of the present disclosure.

FIG. 2 is a top view of a memory cell design of a 3D semiconductor device according to an embodiment of the present disclosure. As shown in FIG. 2, the memory cells are arranged in a plurality of rows having a first direction D1 and a plurality of columns having a second direction D2. The selection line SSL is parallel to the first direction D1, and the included angle θ1 between the first direction D1 and the second direction D2 is an acute angle. According to the embodiments of the present disclosure, as shown in FIG. 2, the adjacent memory cells in the same column are electrically connected to the different bit lines BL. In other words, the memory cells in adjacent rows and in adjacent columns are misaligned.

As shown in FIG. 2, in the embodiment, one of the strings 15 of the memory cells may include a conductive layer 151 and a channel layer 153, and the channel layer 153 surrounds the conductive layer 151; however, the present disclosure is not limited thereto.

In some embodiments, the 3D semiconductor device may further include a plurality of string contacts 17, and the 3D semiconductor device may further include a plurality of the selection lines. The string contacts 17 are formed vertically to the memory layers 12 and the selection lines, and each of the string contacts 17 is disposed correspondingly at each of the strings 15 of the memory cells, wherein the string contacts 17 are electrically connected to the corresponding selection lines 12 and the corresponding bit lines BL. That is, the string contacts 17 at two adjacent rows can be electrically connected to different selections lines. Alternatively, the string contacts 17 at several adjacent rows are electrically connected to one corresponding selection line, and the string contacts 17 at different several adjacent rows are electrically connected to another corresponding selection line; however, the present disclosure is not limited thereto.

As shown in FIG. 2, in the present embodiment, the 3D semiconductor device having one selection line SSL is taken as an example. The string contacts 17 are formed vertically to the memory layers 11 and the selection line SSL, wherein each of the string contacts 17 is disposed correspondingly at each of the strings 15 of the memory cells, and the string contacts 17 are electrically connected to the selection line SSL and the corresponding bit lines BL.

In other words, in the present embodiment, the string contacts 17 in at least two adjacent rows, for example, the string contacts 17 in five adjacent rows Row1-Row5, are electrically connected to one selection line SSL. That is, according to the embodiments of the present disclosure, it is no need to form too many selection lines corresponding to each row of the memory cells.

With the design of the embodiments, the decoding of the device can be supported by less selection lines, which simplifies the manufacturing process and enlarges the process window.

In the embodiments, as shown in FIG. 2, the shape of the string contacts 17 is round. However, the present disclosure is not limited to the shape disclosed above. The string contacts 17 could be formed as round, oral, rectangular or other shape.

According to an embodiment, the adjacent memory cells in the same column are electrically connected to the different bit lines. Take the cells in the first column (Column1) of FIG. 2 as an example, the adjacent memory cells in the first row (Row1) and in the second row (Row2) are electrically connected to the bit lines BL5 and BL4, respectively.

Moreover, in the present embodiment, five bit lines are disposed correspondingly to the memory cells arranged in the same column. For example, the bit lines BL1 to BL5 are disposed correspondingly to the memory cells arranged in the first column (Column1), as shown in FIG. 2.

In FIG. 2, the memory cells in adjacent rows (such as Row1-Row5) and in adjacent columns (such as Column1-Column4) are arranged in a parallelogram array.

The number of the bit lines disposed along the memory cells in the same column could be more than two (ex: 3, 4, 5 . . . ), depending on the requirements of the applications, cost limitation and/or performance of the devices.

According to the structures of the 3D semiconductor devices as illustrated in the embodiments above, all of the memory cells can be read at the same time. Additionally, the bandwidth of the 3D semiconductor device is enlarged, the power consumption is reduced, and the disturbance between adjacent cells during reading is also reduced.

Figure 3:
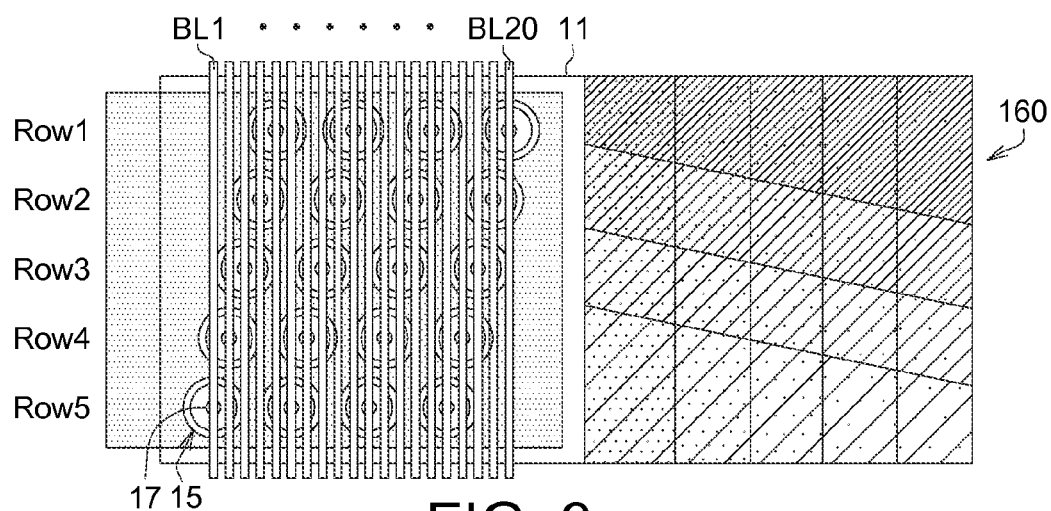
FIG. 3 is a simplified top view of a 3D semiconductor device according to an embodiment of the present disclosure.
Figure 4:
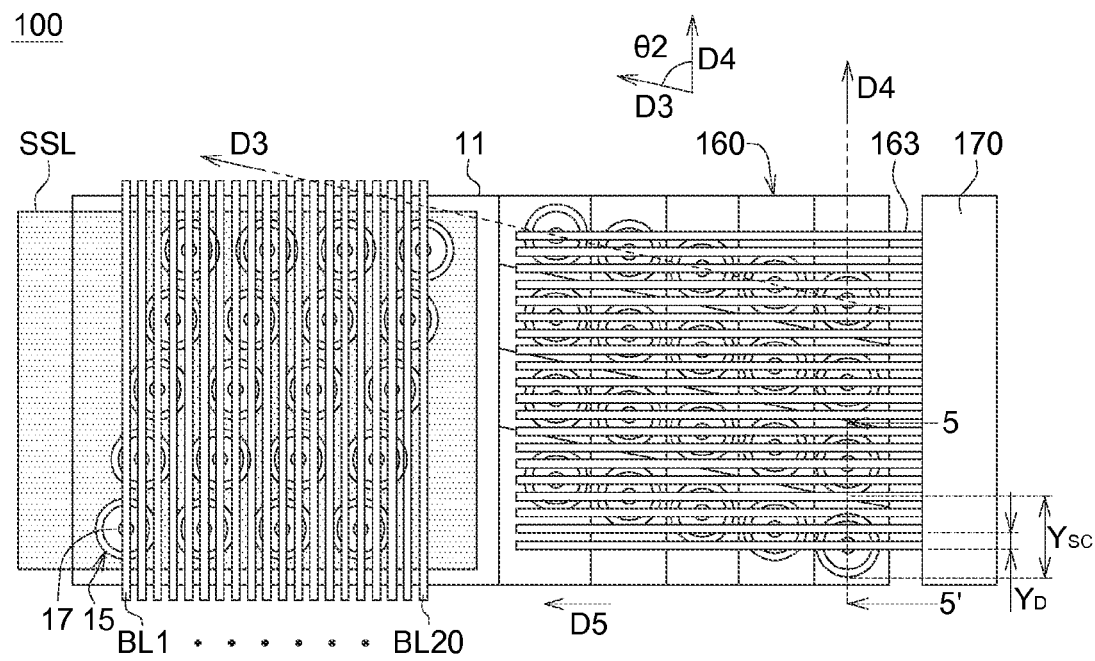
FIG. 4 is a top view of a 3D semiconductor device according to an embodiment of the present disclosure.
Figure 5:
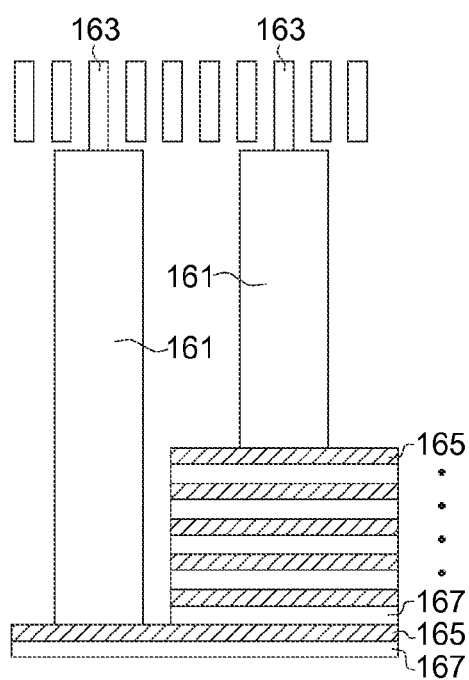
FIG. 5 is a cross-sectional view along the cross-section line 5-5' in FIG. 4.

FIG. 3 is a simplified top view of a 3D semiconductor device according to an embodiment of the present disclosure, FIG. 4 is a top view of a 3D semiconductor device according to an embodiment of the present disclosure, and FIG. 5 is a cross-sectional view along the cross-section line 5-5' in FIG. 4. In FIG. 3, some elements of the stair contact structure in the 3D semiconductor device are omitted for clarity.

As shown in FIG. 4, according to the embodiments of the present disclosure, the 3D semiconductor device may further include a word line decoder 170 electrically connected to the memory layers 11. Moreover, the 3D semiconductor device may further include a page buffer (not shown in drawings) electrically coupled to the memory cells.

As shown in FIGS. 3-5, the stair contact structure 160 includes a plurality of stair contacts 161 and a plurality of conductive lines 163. The stair contact structure 160 is electrically connected to the memory layers 11. Each of the conductive lines 163 is electrically connected to each of the stair contacts 161. The stair contacts 161 are arranged in a plurality of rows having a third direction D3 and a plurality of columns having a fourth direction D4, and the bit lines BL are parallel to the fourth direction D4.

As shown in FIG. 4, the stair contacts 161 are arranged in a matrix along the third direction D3 and the fourth direction D4, and the included angle θ2 between the third direction D3 and the fourth direction D4 is an acute angle.

In addition, according to the embodiments of the present disclosure, the conductive lines 163 are straightly extended from the stair contacts 161 in parallel. As shown in FIG. 4, the conductive lines 163 are straightly extended along a fifth direction D5. The fifth direction D5 is substantially perpendicular to the fourth direction D4.

According to the embodiments of the present disclosure, the word line decoder 170 is electrically connected to the memory layers 11 via the conductive lines 163 and the stair contacts 163.

According to the embodiments of the present disclosure, the 3D semiconductor device satisfies the following condition:

1<A≤10 and 1<B≤30;

A is the number of the rows of the memory cells in one selection line SSL, alternatively, $A=a/X_{BL}$. a is a memory cell pitch along the first direction D1; that is, the memory cell pitch is the distance between two adjacent memory cells along the first direction D1. $X_{BL}$ is a bit line pitch along the first direction D2; that is, the bit line pitch is the distance between two adjacent bit lines BL along the first direction D1. B is a number of the columns of the stair contacts 161, alternatively, $B=Y_{SC}/Y_D$. $Y_{SC}$ is a stair contact pitch along the fourth direction D4; that is, the stair contact pitch is the distance between two adjacent stair contacts along the fourth direction D4. $Y_D$ is a conductive line pitch along the fourth direction D4; that is, the conductive line pitch is the distance between two adjacent conductive lines 161 along the fourth direction D4.

For example, in the 3D semiconductor device as shown in FIGS. 2-3, A is 5, and B is 5. However, there may be other embodiments of the present disclosure which are not specifically illustrated. Therefore, the numerical ranges of the values of A and B value are not limited to what as shown in FIGS. 2-3.

According to the embodiments of the present disclosure, the 3D semiconductor device satisfies the following condition:

1<P≤4, wherein P is B/A.

According to the embodiments of the present disclosure, the 3D semiconductor device satisfies the following condition:

Q≥8, wherein Q is B*A.

According to the embodiments of the present disclosure, the 3D semiconductor device satisfies the following condition: B>A.

Furthermore, according to the embodiments of the present embodiments, when the number of the conductive lines 163 of the stair contact structure 160 is larger than or equal to 32, the number of the selection lines SSL is smaller than or equal to 8.

Figure 6:
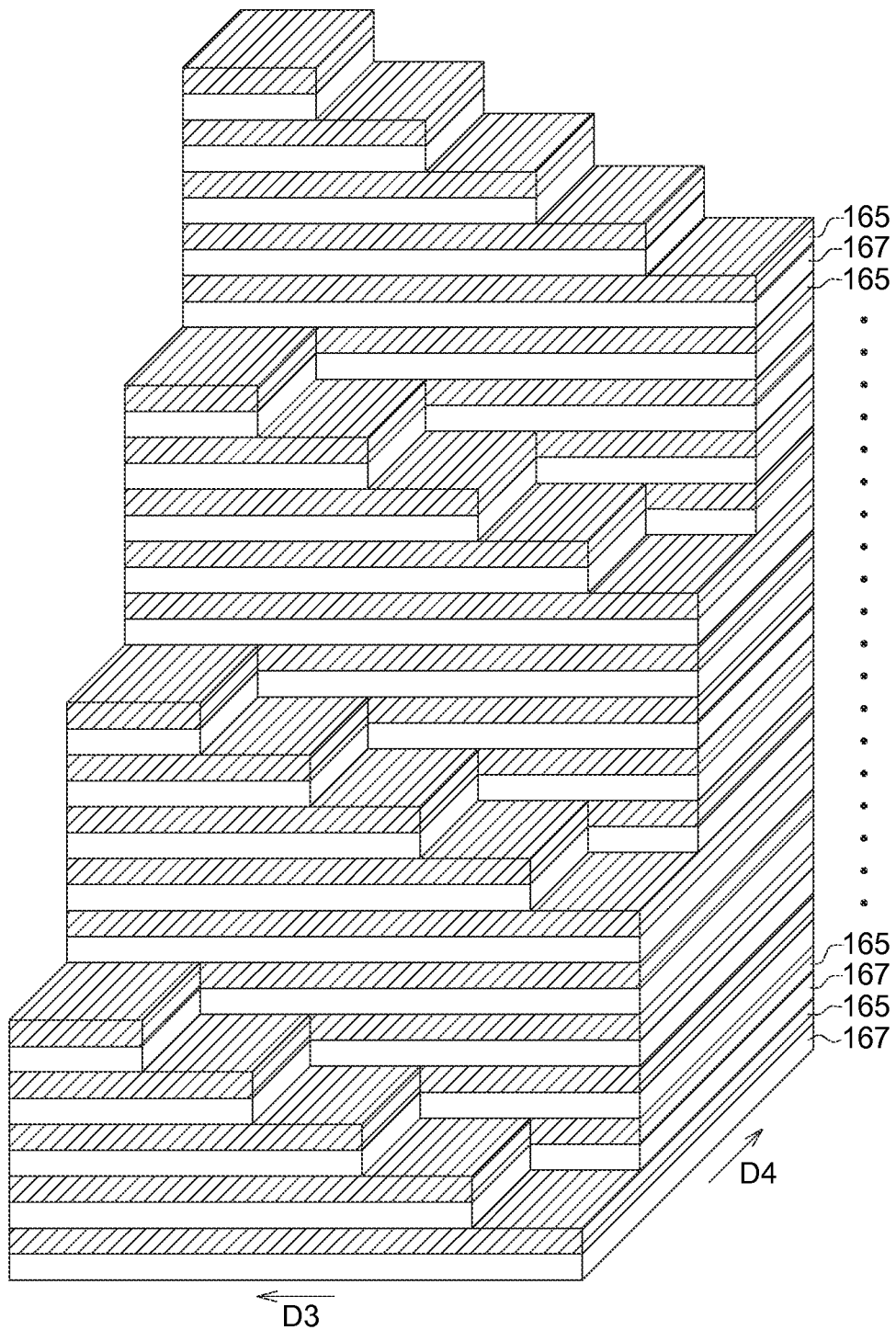
FIGS. 6-7 are perspective views of a stair contact structure according to an embodiment of the present disclosure.
Figure 7:
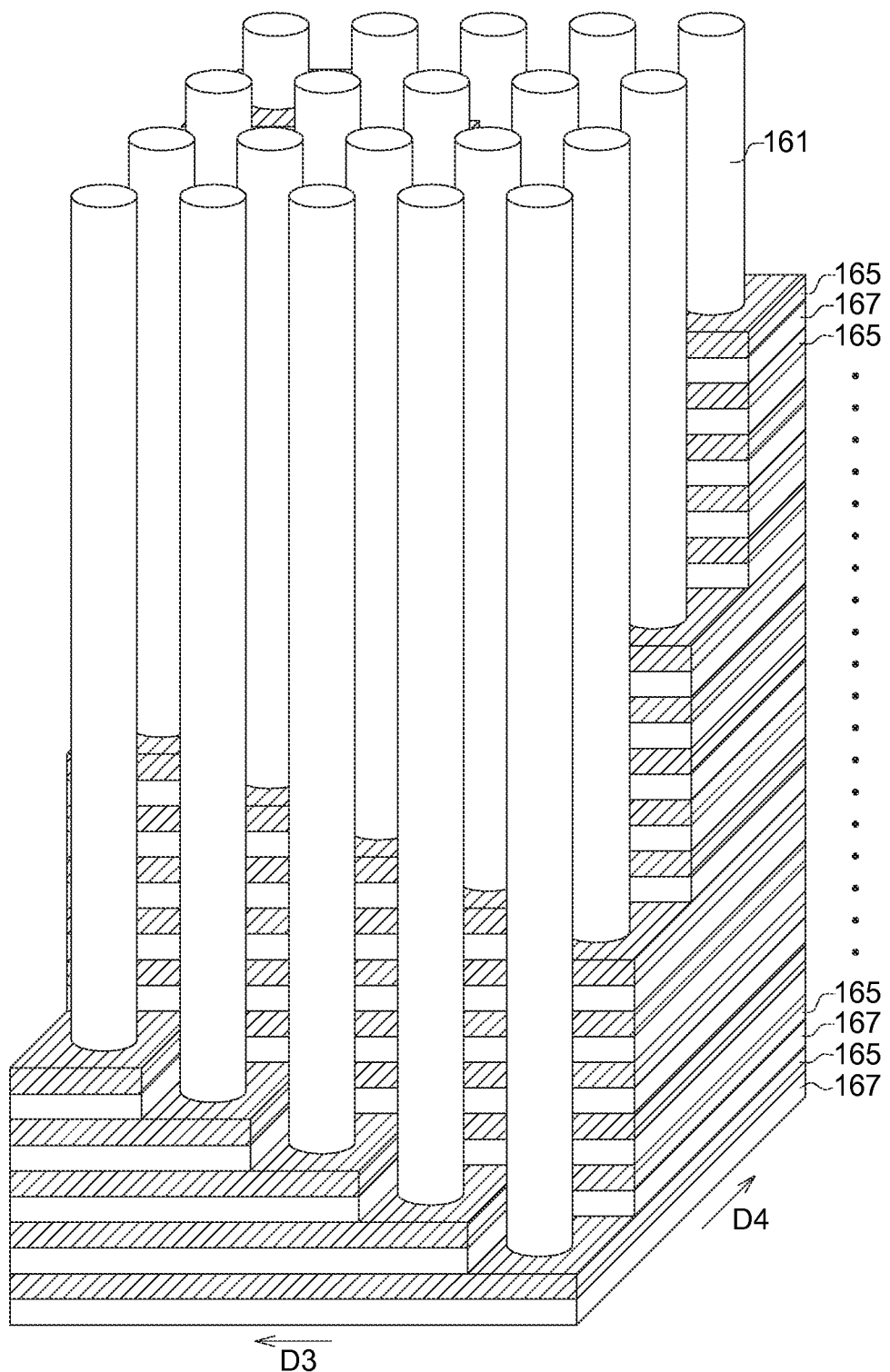

FIGS. 6-7 are perspective views of a stair contact structure according to an embodiment of the present disclosure, wherein some elements are omitted in FIG. 6. As shown in FIGS. 6-7, the stair contact structure 160 further includes a plurality of conductive layers 165 and a plurality of insulating layers 167, wherein the conductive layers 165 and the insulating layers 167 are interlaced stacked.

As shown in FIGS. 4 and 6-7, each of the conductive lines 163 is electrically connected to each of the stair contacts 161 corresponding to each of the conductive layers 165, and each of the conductive layers 165 is electrically connected to each of the memory layers 11.

Below is a further description of the embodiments of the present disclosure. Table 1 shows the simulation results of properties of the 3D semiconductor device while varying the A value and the B value. However, the below embodiments of the disclosure are for illustration only, not for limiting the scope of protection of the disclosure.

In Table 1, the cell half pitch, the number of memory layers, the stair contact half pitch, and the equivalent bit area as 2D NAND half pitch are set at fixed values, the values of A, B (that is, the values of P and Q), and the number of selection lines in one memory block are varied for performing the simulation. Thereby, the bit line density, the page buffer size, the bandwidth, the bit line half pitch, the word line decoder size, the word line connection rule (conductive line), the disturbance, and the power consumption (word line unit cell $CV^2$) are obtained. In Table 1, the bit line density, the page buffer size, the bandwidth, the word line decoder size, the disturbance, and the power consumption are represented as multiple relationships for clearly show the effects of the embodiments 1-3 compared to the comparative embodiment.

TABLE 1

|  | comparative embodiment | embodiment 1 | embodiment 2 | embodiment 3 |
| --- | --- | --- | --- | --- |
| cell half pitch (nm) | 60 | 60 | 60 | 60 |
| number of memory layers | 100 | 100 | 100 | 100 |
| equivalent bit area as 2D NAND half pitch (nm) | 6 | 6 | 6 | 6 |
| stair contact half pitch (nm) | 150 | 150 | 150 | 150 |
| A | 1 | 2 | 5 | 10 |
| B | 1 | 5 | 10 | 25 |
| P | 1 | 2.5 | 2 | 2.5 |
| Q | 1 | 10 | 50 | 250 |
| number of selection lines in one memory block | 250 | 25 | 5 | 1 |
| bit line density | 1x | 2x | 5x | 10x |
| page buffer size | 1x | 2x | 5x | 10x |
| bandwidth | 1x | 2x | 5x | 10x |
| bit line half pitch (nm) | 60 | 30 | 12 | 6 |
| word line decoder size | 1x | 5x | 10x | 30x |
| word line connection rule (nm) | 300 | 30 | 15 | 6 |
| disturbance | 250x | 25x | 5x | 1x |
| word line unit cell $CV^2$ | 250x | 25x | 5x | 1x |

According to the results as shown in Table 1, the bandwidths of the 3D semiconductor device of embodiments 1-3 are enlarged, the power consumption is reduced, and the disturbance between adjacent memory cells during reading is also reduced. Moreover, the bit line density in increased, such that operation speed is increased.

It is noted that the devices and cell arrays as described above are provided for illustration. The disclosure is not limited to the configurations disclosed above, and the exemplified structures could be adjusted and changed based on the actual needs of the practical applications. According to the structures of the 3D semiconductor devices as illustrated in the embodiments above, all of the cells can be read at the same time. Additionally, the bandwidth of the 3D semiconductor device can be enlarged (increased), the power consumption can be reduced, and the disturbance between adjacent cells during reading can also be reduced.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A three-dimensional (3D) semiconductor device, comprising:
   a plurality of memory layers vertically stacked on a substrate and parallel to each other;
   a selection line disposed on the memory layers;
   a plurality of bit lines disposed on the selection line, the bit lines arranged in parallel to each other and in perpendicular to the selection line;
   a plurality of strings electrically connected to the selection line and disposed vertically to the memory layers and the selection line;
   a plurality of memory cells respectively defined by the strings, the selection line, and the bit lines, wherein the memory cells are arranged in a plurality of rows having a first direction and a plurality of columns having a second direction, the selection line is parallel to the first direction, an included angle between the first direction and the second direction is an acute angle, and the adjacent memory cells in the same column are electrically connected to the different bit lines; and
   a stair contact structure electrically connected to the memory layers, comprising:
   a plurality of stair contacts; and
   a plurality of conductive lines, wherein each of the conductive lines is electrically connected to each of the stair contacts, the stair contacts are arranged in a plurality of rows having a third direction and a plurality of columns having a fourth direction, and the bit lines are parallel to the fourth direction;
   wherein the 3D semiconductor device satisfies the following condition:
   $1 < A \leq 10$ and $1 < B \leq 30$;
   wherein A is a number of the rows of the memory cells in the selection line or $A = a/X_{BL}$, wherein a is a memory cell pitch along the first direction, and $X_{BL}$ is a bit line pitch along the first direction; and
   wherein B is a number of the columns of the stair contacts or $B = Y_{SC}/Y_D$, wherein $Y_{SC}$ is a stair contact pitch along the fourth direction, and $Y_D$ is a conductive line pitch along the fourth direction.

2. The 3D semiconductor device according to claim 1, further comprising a plurality of the selection lines disposed on the memory layers and parallel to each other, wherein the bit lines are perpendicular to the selections, the strings are electrically connected to the corresponding selection lines, the memory cells are respectively defined by the strings, the selection lines and the bit lines, and A is a number of the rows of the memory cells in one of the selection lines or $A = a/X_{BL}$.

3. The 3D semiconductor device according to claim 2, further comprising:
   a plurality of string contacts formed vertically to the memory layers and the selection lines, wherein each of the string contacts is disposed correspondingly at each of the strings of the memory cells, and the string contacts are electrically connected to the corresponding selection lines and the corresponding bit lines.

4. The 3D semiconductor device according to claim 2, wherein when a number of the conductive lines of the stair contact structure is larger than or equal to 32, a number of the selection lines is smaller than or equal to 8.

5. The 3D semiconductor device according to claim 2, further comprising:
   a plurality of string contacts formed vertically to the memory layers and the selection line, wherein each of the string contacts is disposed correspondingly at each of the strings of the memory cells, and the string contacts are electrically connected to the selection line and the corresponding bit lines.

6. The 3D semiconductor device according to claim 1, wherein the 3D semiconductor device further satisfies the following condition:
   $1 < P \leq 4$, wherein P is B/A.

7. The 3D semiconductor device according to claim 1, wherein the 3D semiconductor device further satisfies the following condition:
   $Q \geq 8$, wherein Q is B*A.

8. The 3D semiconductor device according to claim 1, wherein the 3D semiconductor device further satisfies the following condition: $B > A$.

9. The 3D semiconductor device according to claim 1, wherein the stair contacts are arranged in a matrix along the third direction and the fourth direction, and an included angle between the third direction and the fourth direction is an acute angle.

10. The 3D semiconductor device according to claim 1, wherein the conductive lines are straightly extended from the stair contacts in parallel.

11. The 3D semiconductor device according to claim 1, wherein the stair contact structure further comprises:
    a plurality of conductive layers; and
    a plurality of insulating layers, wherein the conductive layers and the insulating layers are interlaced stacked;
    wherein each of the conductive lines is electrically connected to each of the stair contacts corresponding to each of the conductive layers, and each of the conductive layers is electrically connected to each of the memory layers.

12. The 3D semiconductor device according to claim 1, wherein one of the strings comprises:
    a conductive layer; and
    a channel layer surrounding the conductive layer.

13. The 3D semiconductor device according to claim 1, further comprising:
    a word line decoder electrically connected to the memory layers.

14. The 3D semiconductor device according to claim 13, wherein the word line decoder is electrically connected to the memory layers via the conductive lines and the stair contacts.

* * * * *